(12) United States Patent
Tsai et al.

(10) Patent No.: US 10,157,791 B2
(45) Date of Patent: Dec. 18, 2018

(54) THROUGH-VIAS AND METHODS OF FORMING THE SAME

(71) Applicant: Taiwan Semiconductor Manufacturing Company, Ltd., Hsin-Chu (TW)

(72) Inventors: Chung-Hao Tsai, Huatan Township (TW); En-Hsiang Yeh, Hsin-Chu (TW); Chuei-Tang Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 716 days.

(21) Appl. No.: 14/491,422

(22) Filed: Sep. 19, 2014

(65) Prior Publication Data

US 2015/0011083 A1    Jan. 8, 2015

Related U.S. Application Data

(62) Division of application No. 13/762,248, filed on Feb. 7, 2013, now Pat. No. 8,916,979.

(60) Provisional application No. 61/746,720, filed on Dec. 28, 2012.

(51) Int. Cl.
*H01L 21/4763* (2006.01)
*H01L 21/768* (2006.01)
*H01L 23/48* (2006.01)

(52) U.S. Cl.
CPC .. *H01L 21/76898* (2013.01); *H01L 21/76831* (2013.01); *H01L 21/76877* (2013.01); *H01L 23/481* (2013.01); *H01L 2224/13* (2013.01)

(58) Field of Classification Search
CPC ....... H01L 23/5226; H01L 2924/01078; H01L 2924/01079; H01L 21/76804; H01L 21/31116
USPC ....... 438/612, 622, 629, 637–640, 667, 668, 438/672, 675, 700, 701, 713, 978; 257/E21.578, E21.597, E23.011, 693, 257/698, 702, 774, 775, 758
See application file for complete search history.

(56) References Cited

U.S. PATENT DOCUMENTS

| 5,229,647 | A | 7/1993 | Gnadinger | |
|---|---|---|---|---|
| 6,828,175 | B2 | 12/2004 | Wood et al. | |
| 7,279,750 | B2 * | 10/2007 | Jobetto | H01L 23/552 257/347 |
| 7,811,920 | B2 * | 10/2010 | Matsui | H01L 23/481 257/693 |

(Continued)

FOREIGN PATENT DOCUMENTS

KR    101073618    11/2011

OTHER PUBLICATIONS

Khan, N.H., et al., "Power Delivery Design for 3-D ICs Using Different Through-Silicon Via (TSV) Technologies," IEEE Transactions on Very Large Scale Integration (VLSI) Systems, vol. 19, No. 4, Apr. 2011, 12 pgs.

*Primary Examiner* — Matthew Reames
*Assistant Examiner* — Chris Chu
(74) *Attorney, Agent, or Firm* — Slater Matsil, LLP

(57) ABSTRACT

An integrated circuit structure includes a substrate, a metal ring penetrating through the substrate, a dielectric region encircled by the metal ring, and a through-via penetrating through the dielectric region. The dielectric region is in contact with the through-via and the metal ring.

20 Claims, 12 Drawing Sheets

(56) References Cited

U.S. PATENT DOCUMENTS

| | | | |
|---|---|---|---|
| 7,880,307 B2* | 2/2011 | Farnworth | H01L 21/76898 257/774 |
| 7,994,641 B2* | 8/2011 | Inohara | H01L 21/76898 257/510 |
| 8,519,515 B2 | 8/2013 | Kuo et al. | |
| 2002/0180029 A1* | 12/2002 | Higashitani | H01L 21/4853 257/700 |
| 2005/0121768 A1 | 6/2005 | Edelstein et al. | |
| 2005/0282314 A1 | 12/2005 | Lo et al. | |
| 2006/0001174 A1 | 1/2006 | Matsui | |
| 2008/0067665 A1* | 3/2008 | Aziz | H01L 23/49827 257/698 |
| 2011/0095435 A1 | 4/2011 | Volant et al. | |
| 2011/0254169 A1 | 10/2011 | Lin | |
| 2012/0018893 A1 | 1/2012 | Oganesian et al. | |

* cited by examiner

THROUGH-VIAS AND METHODS OF FORMING THE SAME

PRIORITY CLAIM AND CROSS-REFERENCE

This application is a divisional of U.S. patent application Ser. No. 13/762,248, entitled "Through-Vias and Methods of Forming the Same," filed on Feb. 7, 2013, which claims the benefit U.S. Provisional Application Ser. No. 61/746,720, filed Dec. 28, 2012, and entitled "Through-Vias and Methods of Forming the Same;" which application is hereby incorporated herein by reference.

BACKGROUND

In three-dimensional integrated circuits, a device die may be stacked on another device die, or stacked on an interposer, a package substrate, and the like. Through-Substrate Vias (TSVs, also known as through-silicon vias) are used to make electrical connections from one side of device die to the opposite side. A device die include many TSVs therein.

TSVs are formed in semiconductor substrates such as silicon substrates. Each of the TSVs may be separated from the respective semiconductor substrate by an insulation layer. Accordingly, a TSV forms a capacitor with the insulation layer and the semiconductor substrate, with the TSV and the semiconductor substrate acting as two capacitor plates, and the insulator acting as the capacitor insulator. When the semiconductor substrate is electrically floating or has an inferior grounding, signals in the TSVs are coupled to the semiconductor substrate, and are further coupled to other TSVs. Each of the TSVs thus acts as a noise source for other TSVs.

Some of the signals that are transferred through the TSVs might be more prone to the effect of the noise from other TSVs. For example, Radio Frequency (RF) signals, analog signals, and weak digital signals are more likely to be affected. Such adverse effect needs to be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Through-vias and the method of forming the same are provided in accordance with various exemplary embodiments. The intermediate stages of forming the through-vias are illustrated. The variations of the embodiments are discussed. Throughout the various views and illustrative embodiments, like reference numbers are used to designate like elements.

Figure 1:
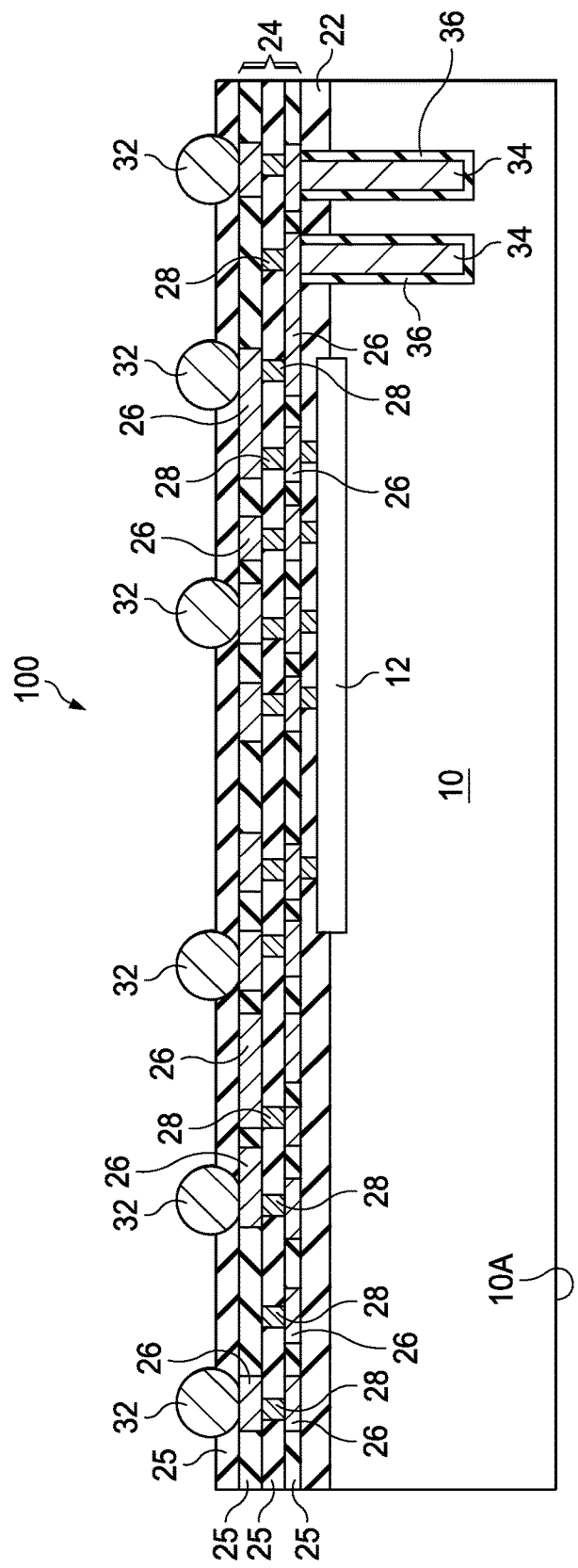
FIGS. 1 through 10B are cross-sectional views of intermediate stages in the manufacturing of a package component comprising through-vias in accordance with some exemplary embodiments.

Referring to FIG. 1, substrate 10 is provided. Substrate 10 may be a part of wafer 100. The illustrated structure is a portion of a chip/die in wafer 100, which includes a plurality of chips identical to the illustrated chip. Substrate 10 may be formed of a semiconductor material, such as silicon, silicon germanium, silicon carbon, III-V compound materials, gallium arsenide, or other commonly used semiconductor materials. Alternatively, substrate 10 is formed of a dielectric material such as silicon oxide. Wafer 100 may include active devices such as transistors at the surface of substrate 10, which active devices are illustrated as devices 12. In the respective embodiments, wafer 100 is a device wafer, and the respective chips/dies therein are device chips/dies. Alternatively, wafer 100 is free from active devices, and may include, or may be free from, passive devices such as capacitors, resistors, inductors, varactors, and/or the like (not shown). In the respective embodiments, wafer 100 is an interposer wafer comprising interposers. In the embodiments wherein no active devices are formed at the surfaces of substrate 10, substrate 10 may also be formed of semiconductor materials.

Wafer 100 may further include Inter-Layer Dielectric (ILD) 22 over semiconductor substrate 10, and interconnect structure 24 over ILD 22. Interconnect structure 24 includes metal lines 26 and vias 28, which are formed in dielectric layers 25. The combination of metal lines at a same level is referred to a metal layer hereinafter. In some embodiments, interconnect structure 24 includes a plurality of metal layers that are interconnected through vias 28. Metal lines 26 and vias 28 may be formed of copper or copper alloys, although they can also be formed of other metals. In some embodiments, dielectric layers 25 include low-k dielectric layers formed of low-k dielectric materials. The dielectric constants (k values) of the low-k dielectric materials may be smaller than about 3.0, or smaller than about 2.5, for example. Passivation layers, polymer layers, and the like, which are also schematically illustrated as layer 25, may be formed over the low-k dielectric materials. Metal pads (not shown), Post-Passivation Interconnect (PPI), and the like, may be formed over, and electrically coupled to, metal lines 26 and vias 28. The details of the metal pads and the PPI are not shown. Electrical connectors 32, such as metal pillars, pre-solder layer, bond pads, and/or the like, may be formed at the top surface of wafer 100, and electrically couple to metal lines 26 and vias 28.

In some embodiments, through-vias 34, sometimes referred to as Through Silicon Vias or Through Substrate Vias (TSVs), are formed in substrate 10. In the embodiments wherein substrate 10 is a semiconductor substrate, insulation layers 36 are formed to insulate through-vias 34 from substrate 10, wherein insulation layers 36 are dielectric layers. Insulation layers 36 may comprise silicon nitride, silicon carbide, silicon oxynitride, silicon oxide, or the like. In the embodiments wherein substrate 10 is a dielectric substrate, through-vias 34, which are conductive and may be metal vias, may be in contact with substrate 10, and insulation layers 36 may not be formed. In alternative embodiments, no through-vias 34 are formed. In yet alternative embodiments, through-vias 34 are not formed at this time. Rather, through-vias 34 are formed in subsequent process steps.

Figure 2:
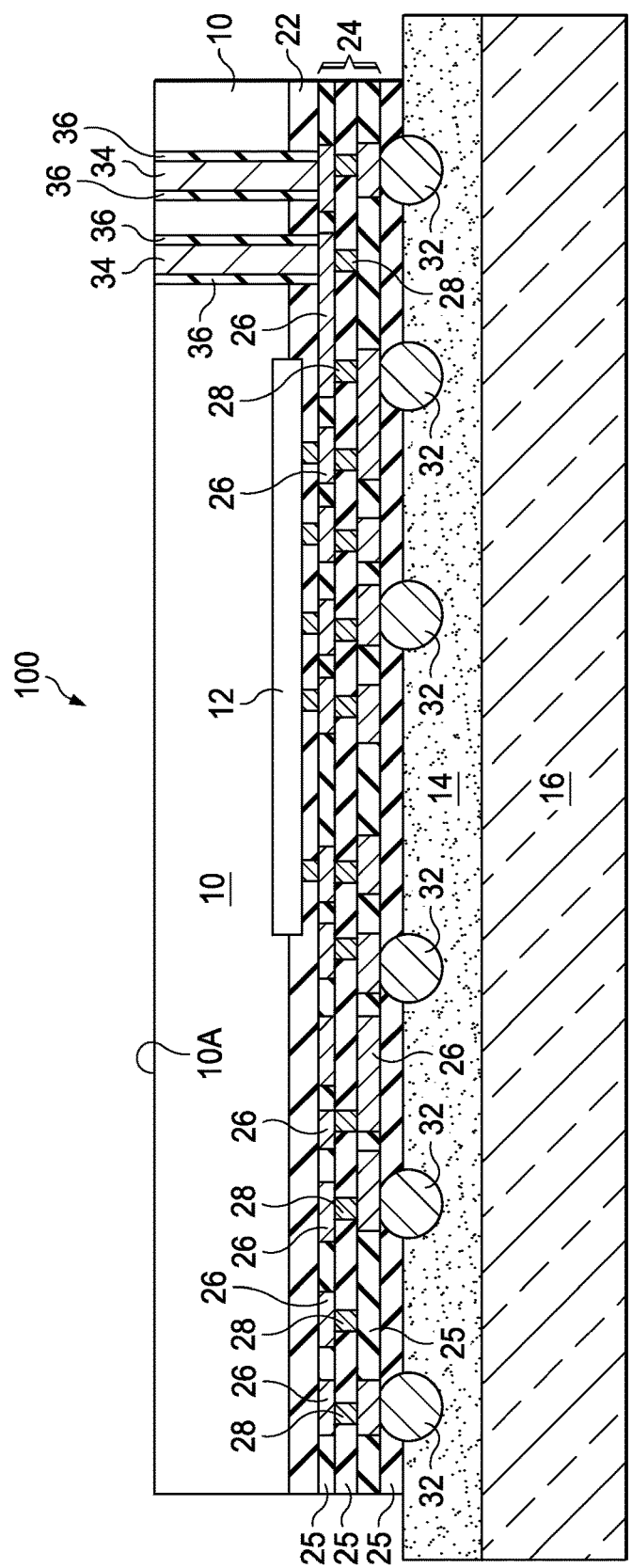

Wafer 100 is flipped upside down, with back surface 10A of substrate 10 facing up. As shown in FIG. 2, wafer 100 is mounted on carrier 16 through adhesive 14, wherein carrier 16 may be a glass carrier, a ceramic carrier, or the like. A backside grinding may be performed on back surface 10A to thin substrate 10. In the embodiments wherein through-vias 34 are formed in substrate 10, the backside grinding is performed until through-vias 34 are exposed.

Figure 3:
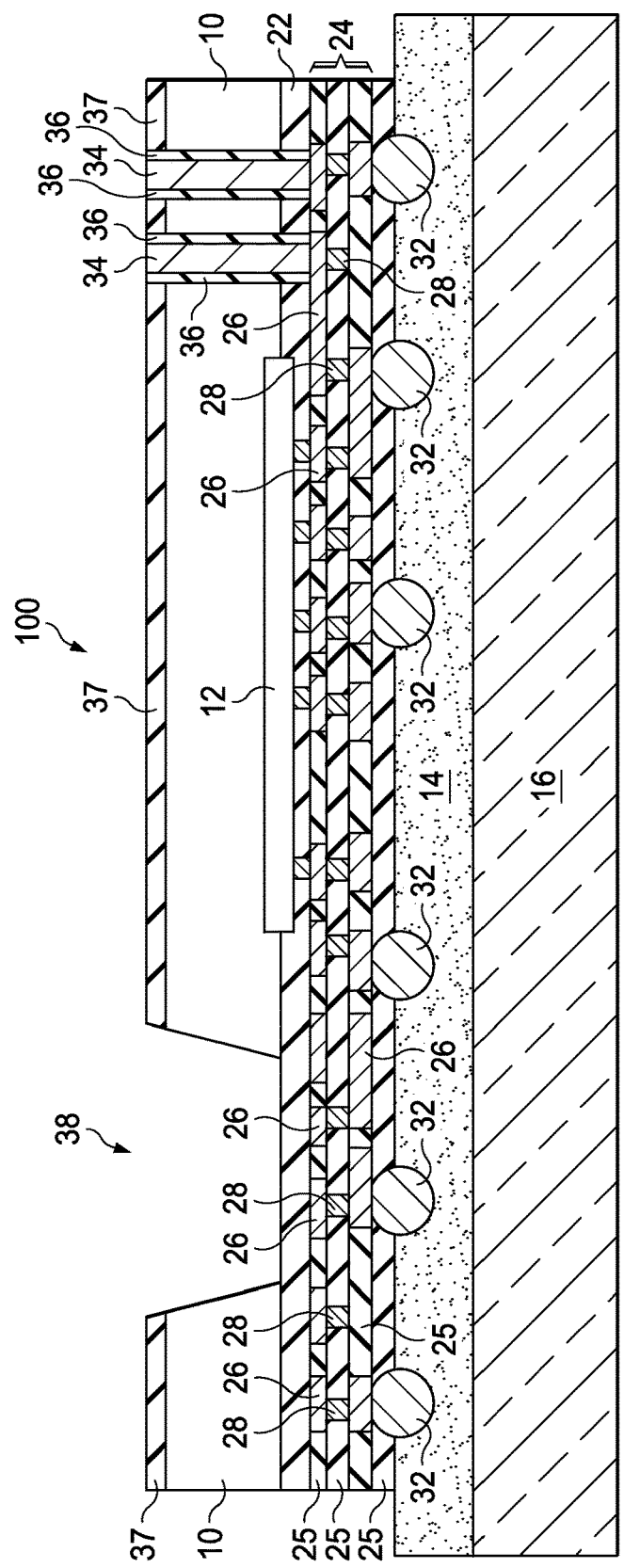
Figure 4:
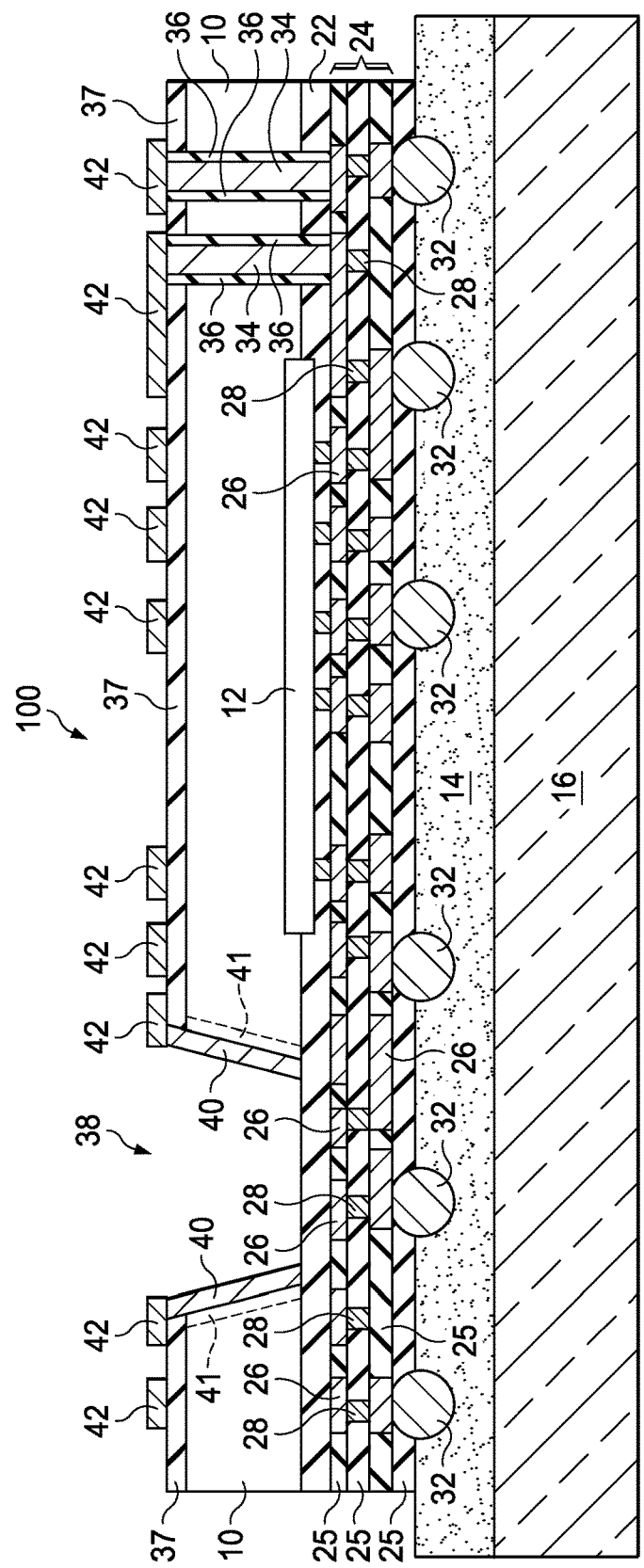

Next, referring to FIG. 3, insulation layer 37 is formed on back surface 10A, wherein insulation layer 37 comprises a dielectric material such as silicon nitride. Through-vias 34 penetrate through insulation layer 37, and are exposed. In a subsequent step, through-opening 38 is formed to penetrate through substrate 10. In some embodiments, the dielectric layer underlying substrate 10 is used as an etch stop layer, wherein the dielectric layer may be ILD 22 or a contact etch stop layer (not shown) that is used for forming contact plugs. Through-opening 38 may be formed using laser drilling, etching, or the like. The sidewalls of through-opening 38 may be slanted, as illustrated in FIG. 4. Alternatively, the sidewalls of through-opening 38 are substantially vertical.

Referring to FIG. 4, conductive ring 40 and Redistribution Lines (RDLs) 42 are formed. Isolation layer 41 (which forms a ring, and hence is referred to as isolation ring 41 hereinafter), which is a dielectric layer, may be formed to separate conductive ring 40 from substrate 10 in accordance with some embodiments. Isolation ring 41 may comprise silicon nitride, silicon carbide, and the like. In alternative embodiments, isolation ring 41 is not formed, and conductive ring 40 is in contact with substrate 10. In some embodiments, the formation of conductive ring 40 and RDLs 42 includes forming a blanket conductive layer, and then patterning the conductive blanket layer. In alternative embodiments, the formation of conductive ring 40 and RDLs 42 includes sputtering a blanket seed layer on the structure shown in FIG. 3, forming a patterned mask over the seed layer, and then plating conductive ring 40 and RDLs 42 in the openings of the patterned mask. The mask is then removed, followed by the removal of the portions of the seed layer covered by the mask. The materials of conductive ring 40 and RDLs 42 may include aluminum, nickel, copper, tungsten, or the like. Conductive ring 40 may be formed as a full ring encircling opening 38. In the embodiments wherein through-vias 34 are formed, some of RDLs 42 are electrically coupled to through-vias 34.

Figure 5:
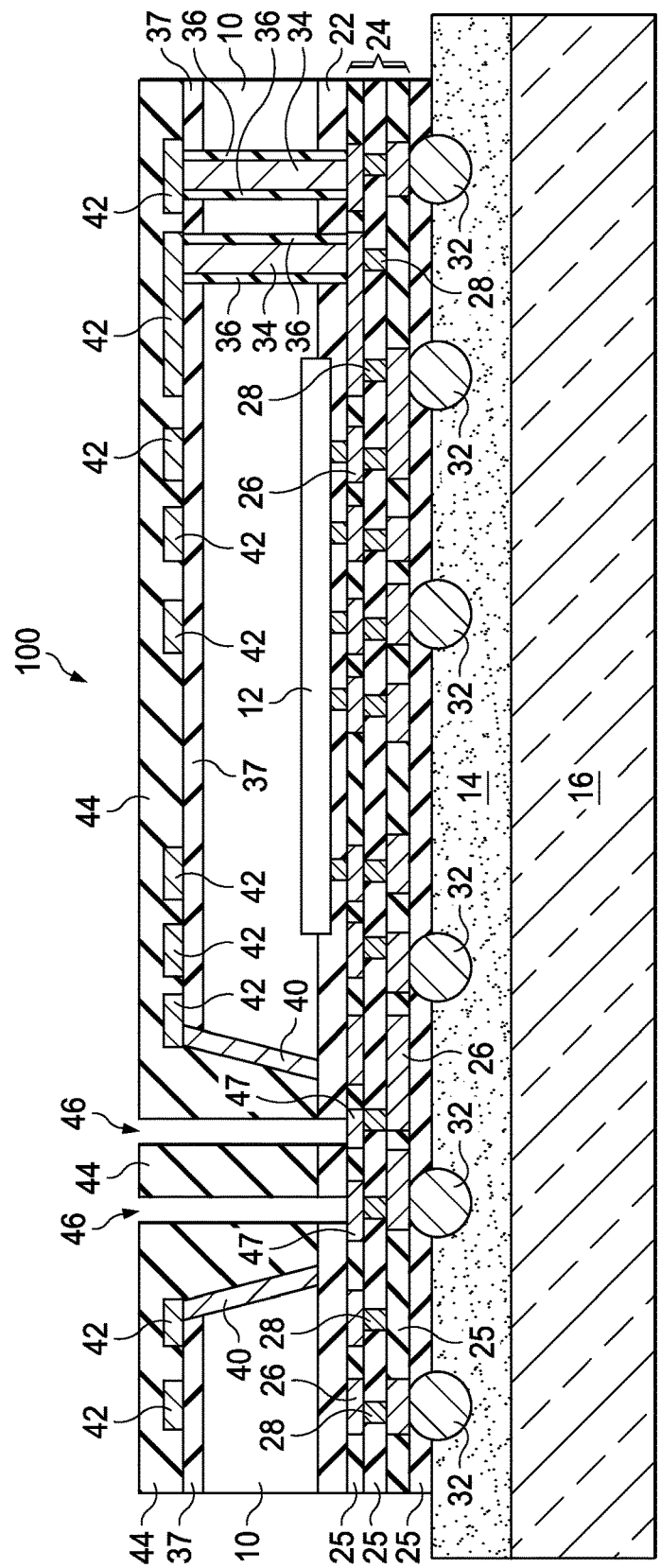

FIG. 5 illustrates the filling of dielectric material 44 into opening 38 (FIG. 4). Dielectric material 44 may also include a portion over RDLs 42, and hence RDLs 42 are covered. In some embodiments, dielectric material 44 includes a polymer, which may be polyimide, polybenzoxazole (PBO), benzocyclobutene (BCB), or the like. In alternative embodiments, dielectric material 44 includes a flowable oxide, which may be a Hydrogen SilseQuioxane-based (HSQ-based) oxide. Dielectric material 44 may be a homogeneous material, wherein all regions of dielectric material 44 are formed of a same dielectric material. Dielectric material 44 may be applied using spin coating, and is then cured. The resulting dielectric material 44 has a substantially planar top surface.

Next, as also shown in FIG. 5, through-openings 46 are formed in dielectric material 44. A further etch is performed to remove portions of dielectric layer 22 that are exposed through through-openings 46, and hence metal pads 47 are revealed. In some embodiments, metal pads 47 are in the bottom metal layer of interconnect structure 24. In the etching of dielectric layer 22, dielectric material 44 is used as an etching mask.

Figure 6:
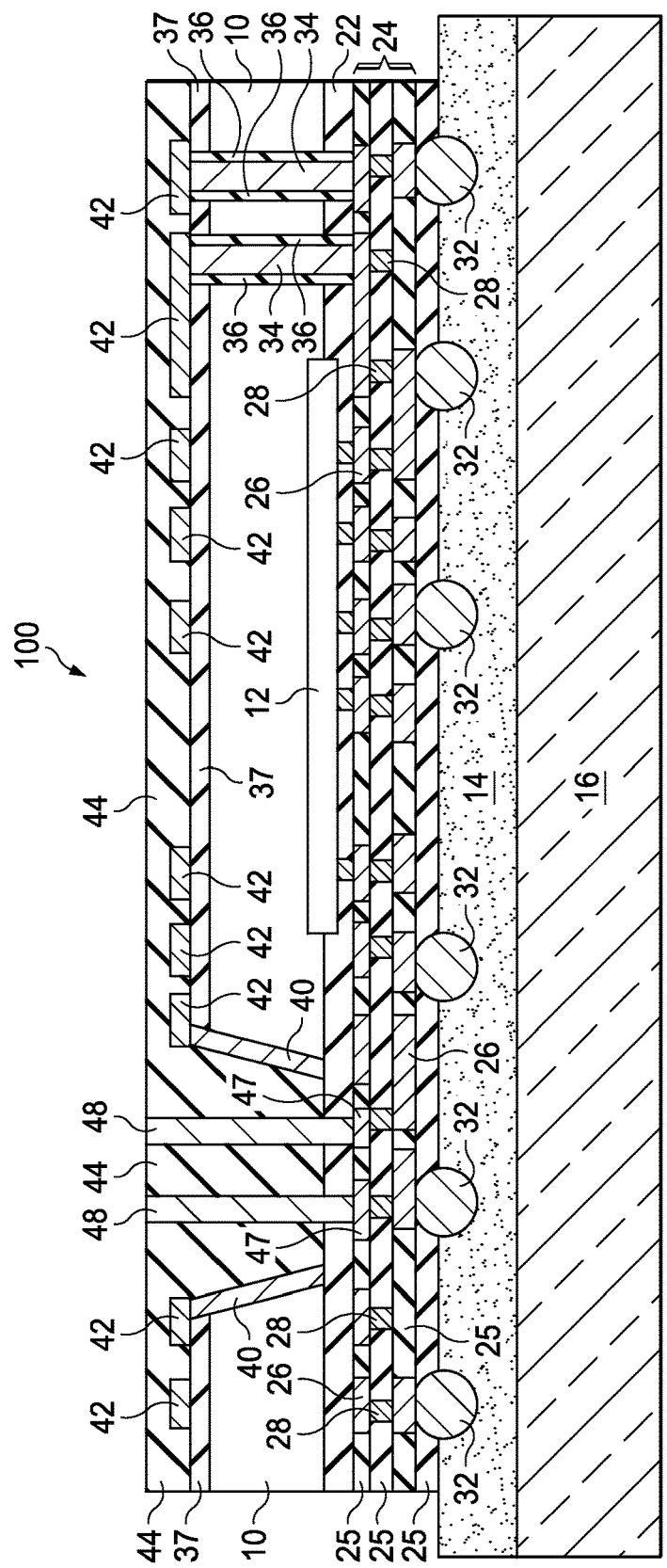

Through-openings 46 are filled with a conductive material to form through-vias 48 (FIG. 6), wherein the resulting structure is shown in FIG. 6. Through-vias 48 hence penetrate through dielectric material 44. Since dielectric material 44 penetrates through substrate 10, through-vias 48 also penetrate through substrate 10. The filling step for forming through-vias 48 may include, for example, electro plating or electro-less plating. Through-vias 48 may have their top surfaces substantially level with, or lower than, the top surface of dielectric material 44. In some embodiments, through-vias 48 are formed of a homogeneous material that is in physical contact with dielectric material 44. Alternatively, through-vias 48 may also include a barrier ring (not shown) comprising titanium, titanium nitride, tantalum, tantalum nitride, etc., and an inner core encircled by the barrier ring, wherein the inner core may include copper, aluminum, tungsten, or alloys thereof.

Figure 7:
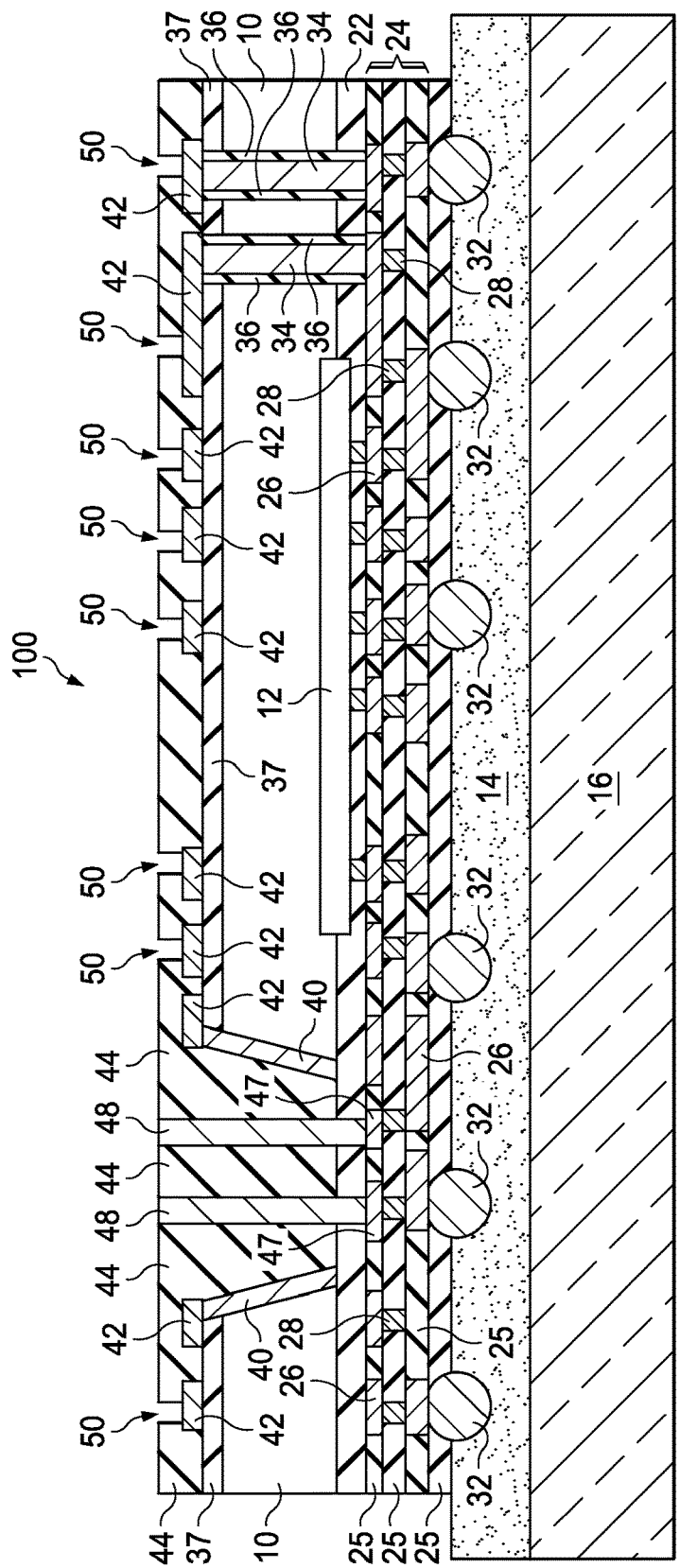
Figure 8:
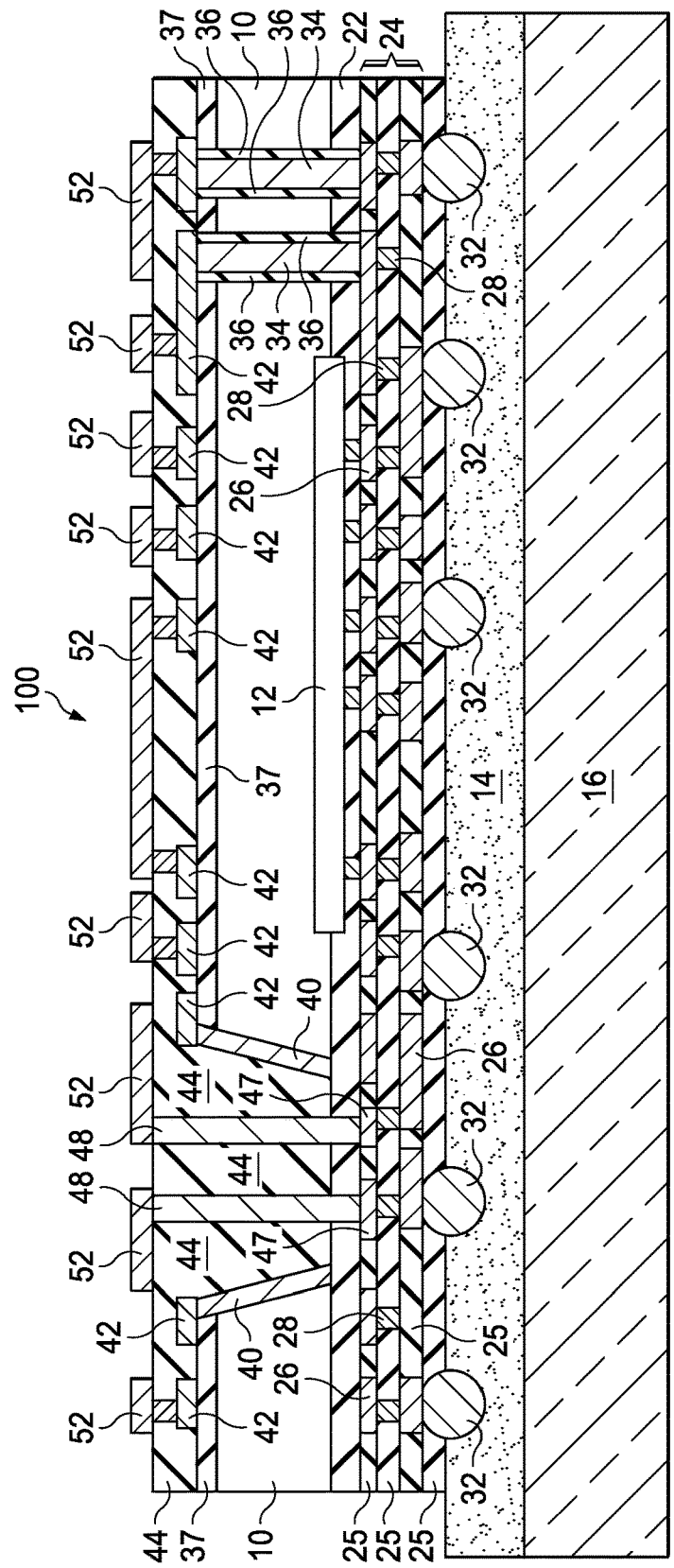
Figure 9:
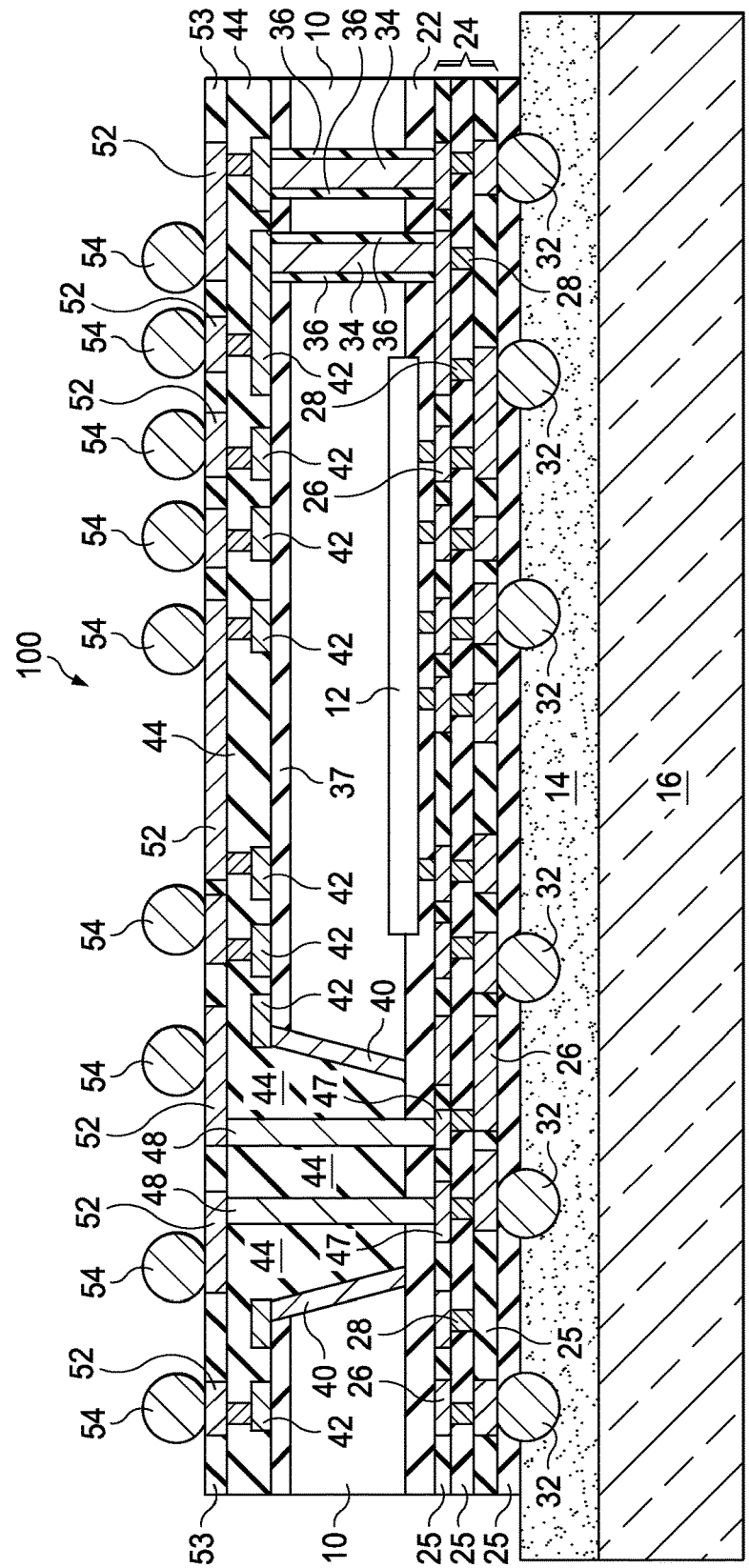

FIGS. 7 and 8 illustrate the formation of more RDLs over and electrically coupled to through-vias 48, RDLs 42, and through-vias 34, if any. In FIG. 7, openings 50 are formed in dielectric material 44 to expose RDLs 42, wherein the formation of openings 50 includes etching. Next, as shown in FIG. 9, RDLs 52 are formed to electrically couple to RDLs 42 and through-vias 48. The formation of IDLs 52 may be performed using the same methods used in the formation of conductive ring 40 and RDLs 42.

FIG. 9 illustrates the formation of dielectric layer 53, which may fill the spaces between RDLs 52. Dielectric layer 53 may be a passivation layer formed of for example, an oxide layer and overlying nitride layer. Alternatively, dielectric layer 53 may be formed of a polymer such as polyimide, PBO, or the like. Although not shown, additional layers of RDLs may be formed over and electrically couple to RDLs 52. Additional electrical connectors 54 may be formed over and electrically coupled to RDLs 52.

Figure 10A:
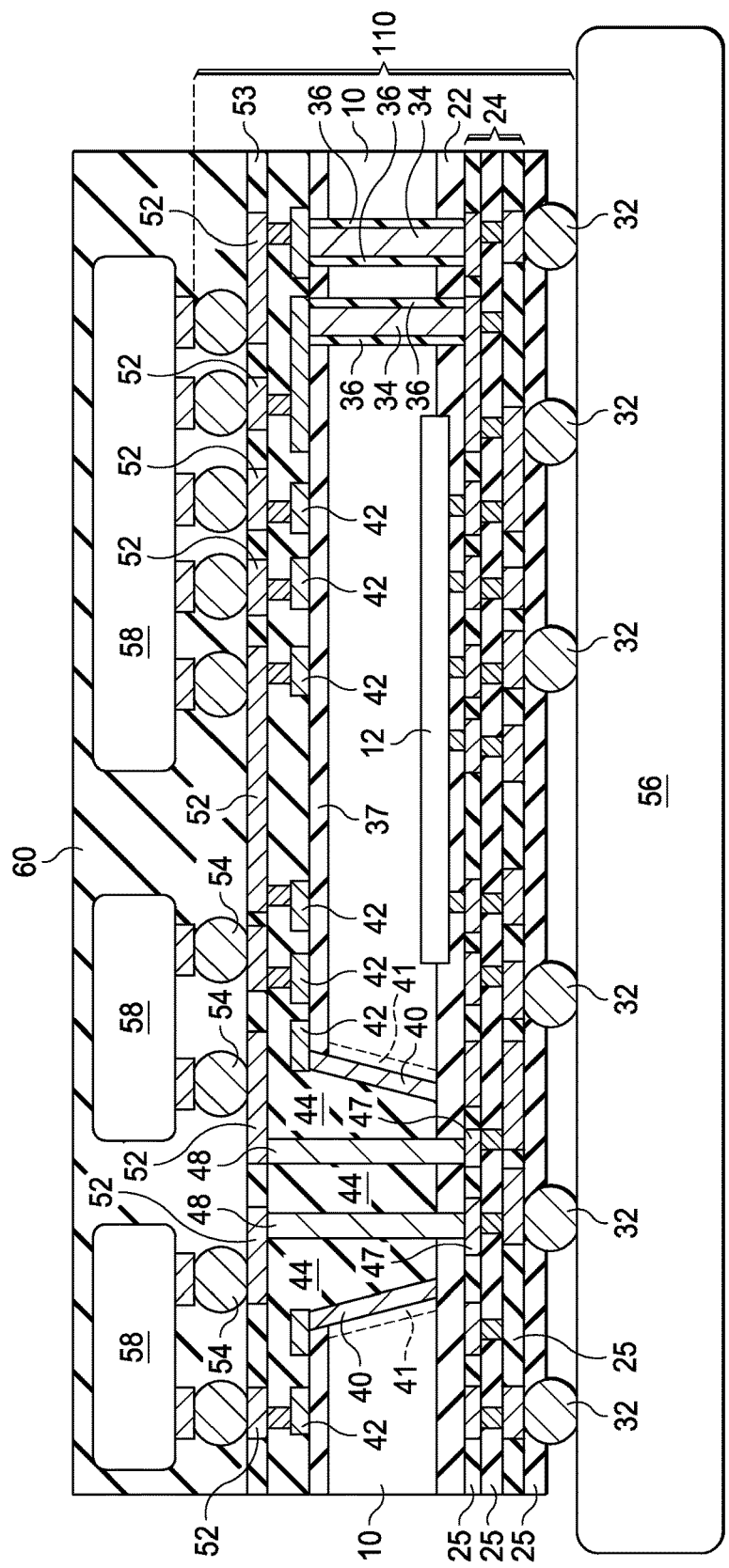

Wafer 100 may then be demounted from carrier 16, and adhesive 14 is removed from wafer 100. Wafer 100 is sawed apart into a plurality of dies. For example, FIG. 10A illustrates one of dies 110 sawed from wafer 100, and package component 56 bonded to die 110. Package component 56 may be an interposer, a package substrate, a printed circuit board, or the like. Furthermore, additional package components 58 such as device dies may also be bonded to die 110. Molding compound 60 may be used to mold package component 58 therein. Through-vias 48 and 34 are thus used to electrically inter-couple features on opposite sides of substrate 10, and may be used to inter-couple package components 56 and 58. In FIG. 10A, isolation ring 41 is shown using dashed lines to indicate that isolation ring 41 may be, or may not be, formed. For example, as shown in FIG. 10A, dielectric ring 41 may not be formed, and hence conductive ring 40 is in physical contact with substrate 10, which may be a semiconductor substrate or a dielectric substrate. In alternative embodiments, isolation ring 41 is formed, and hence conductive ring 40 may be separated from substrate 10 by isolation ring 41.

Figure 10B:
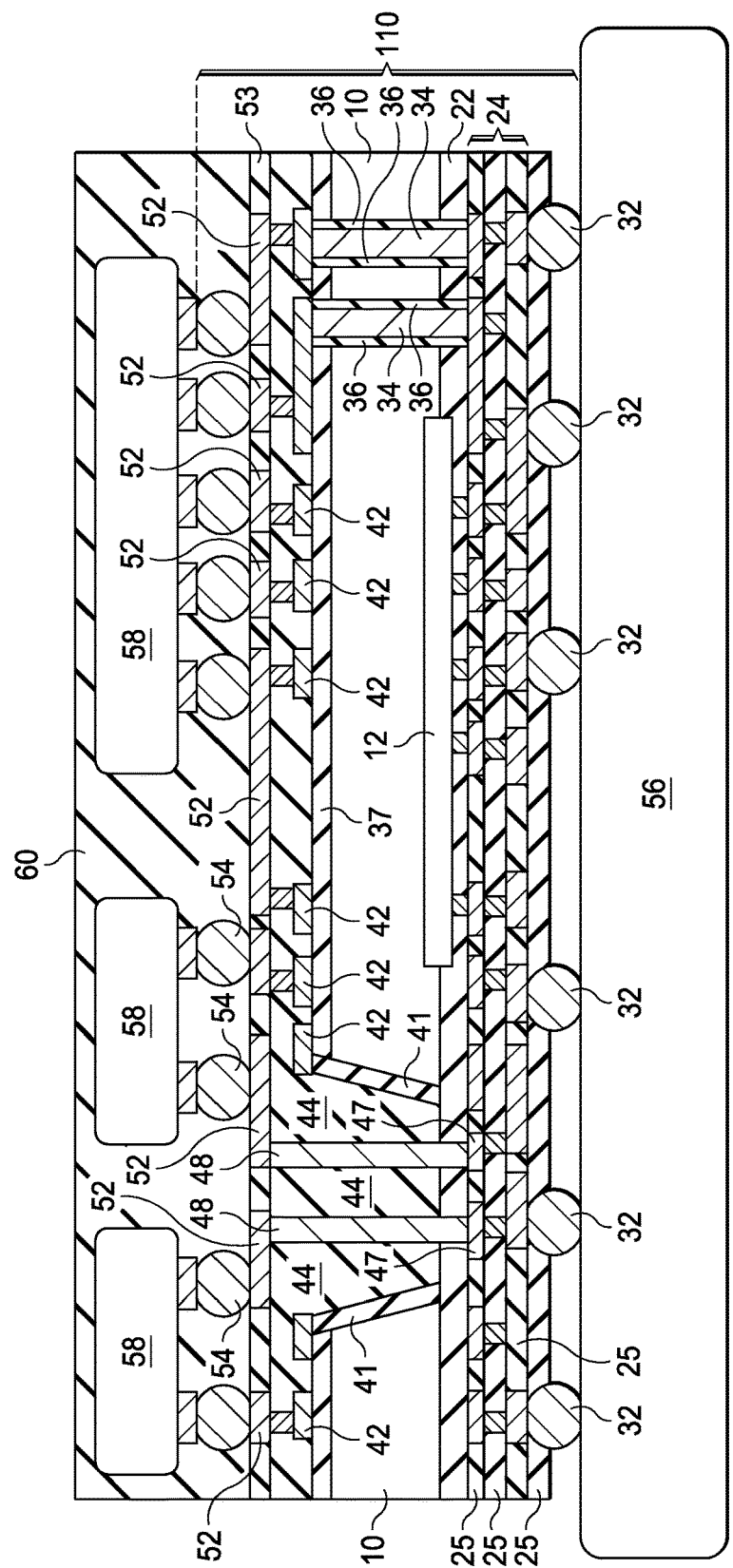

FIG. 10B illustrates wafer 100 in accordance with alternative embodiments. In these embodiments, conductive ring 40 is not formed. Isolation ring 41 is formed on the sidewalls of substrate 10, and spaces substrate 10 from dielectric material 44. In these embodiments, substrate 10 may be a semiconductor substrate such as a silicon substrate.

In the embodiments illustrated in FIGS. 1 through 10, dielectric material 44 and through-vias 48 are formed from the backside of substrate 10. In alternative embodiments, through-vias 48 may also be formed from the front side of substrate 10, for example, at a similar time as the formation of through-vias 34. In these embodiments, however, the openings in which through-vias 48 are filled and the openings in which through-vias 34 are filled may be formed separately, although they may be filled simultaneously or separately. In addition, when through-vias 48 are formed from the front side of substrate 10, through-vias 48 may be formed before or after the formation of interconnect structure 24.

Figure 11:
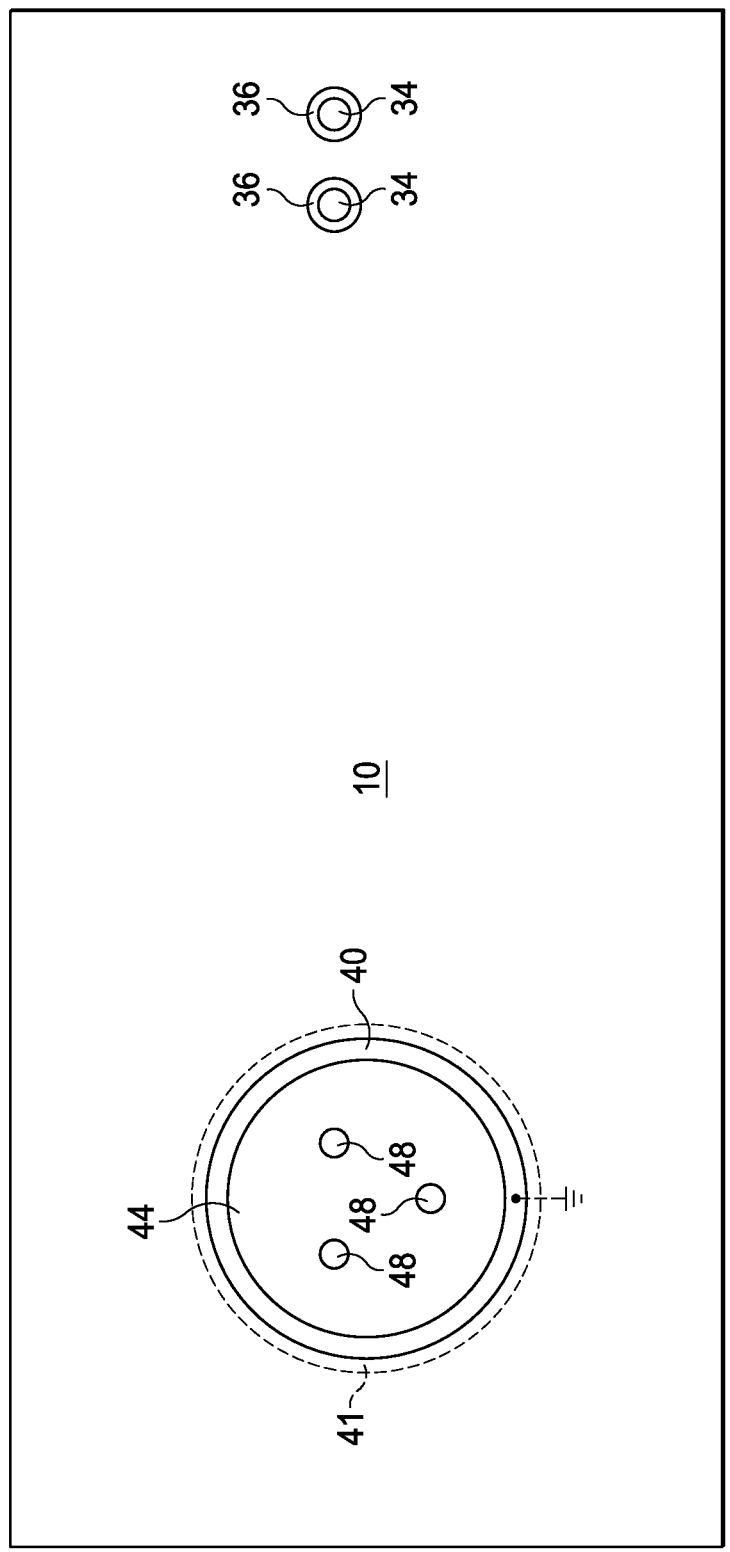
FIG. 11 illustrates a top view of through-vias in accordance with some exemplary embodiments.

FIG. 11 schematically illustrates a top view of conductive ring 40 and through-vias 48 formed therein. In some embodiments, conductive ring 40 is electrically grounded. In alternative embodiments, conductive ring 40 is connected to a constant voltage, which is not the ground voltage. In yet other embodiments, conductive ring 40 is electrically floating. Through-vias 48 are spaced apart from each other by dielectric material 44, with no portion of substrate 10 therebetween. In the embodiments wherein substrate 10 comprises a semiconductor material, since signal transmission has a higher loss in semiconductor materials than in dielectric materials, separating through-vias 48 from other vias using dielectric material 44 results in a smaller loss for the signals transmitted in through-vias 48 than the signals transmitted in through-vias 34. Furthermore, through-vias 48 is less prone to cross-talk due to the use of dielectric material 44. Through-vias 48 may thus be used to transmit signals that are sensitive to signal loss and crosstalk, which signals may include, for example, Radio Frequency (RF) signals, analog signals, small digital signals, and the like. Furthermore, through-vias 34 may also be formed in substrate 10, and may carry non-sensitive signals such as strong digital signals. In addition, isolating through-vias 48 using dielectric material 44 may result in through-vias 48 to be less prone to the damage of Electro-Static Discharge (ESD).

In accordance with embodiments, an integrated circuit structure includes a substrate, a metal ring penetrating through the substrate, a dielectric region encircled by the metal ring, and a through-via penetrating through the dielectric region. The dielectric region is in contact with the through-via and the metal ring.

In accordance with other embodiments, an integrated circuit structure includes a semiconductor substrate, a polymer region penetrating through the semiconductor substrate, and a through-via penetrating through the polymer region.

In accordance with yet other embodiments, a method includes forming a first through-opening in a substrate, filling the first through-opening with a dielectric material, forming a second through-opening in the dielectric material, and filling the second through-opening with a conductive material to form a through-via. A redistribution line is formed overlying and electrically coupled to the through-via.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   from a front side of a substrate, forming a first through-via extending from a front surface of the substrate into the substrate;
   performing a backside grinding on the substrate from a backside of the substrate, wherein the first through-via is revealed from a back surface of the substrate;
   forming a first through-opening from the backside of the substrate;
   filling the first through-opening with a dielectric material;
   forming a second through-opening in the dielectric material; and
   filling the second through-opening with a conductive material to form a second through-via.

2. The method of claim 1 further comprising:
   before the filling the first through-opening with the dielectric material, forming a conductive region on sidewalls of the first through-opening.

3. The method of claim 1, wherein the filling the first through-opening with the dielectric material comprising filling a polymer in the first through-opening.

4. The method of claim 1 further comprising forming an active device at the front surface of the substrate.

5. The method of claim 1, wherein the forming the first through-opening is performed after the backside grinding.

6. The method of claim 4, wherein a portion of the active device extends into the substrate.

7. The method of claim 1 further comprising, after the forming the first through-opening in the substrate and before the filling the first through-opening with the dielectric material:
   forming an isolation ring in the first through-opening, wherein the isolation ring is on a sidewall of the substrate; and
   forming a conductive ring in the first through-opening, wherein the conductive ring is encircled by the isolation ring.

8. The method of claim 1, wherein in the forming the first through-opening from the backside of the substrate, the first through-opening stops on a dielectric layer on the front side of the substrate, and in the forming the second through-opening, a conductive feature on the front side of the substrate is exposed.

9. A method comprising:
   forming an active device at a front surface of a substrate;
   performing a backside grinding on the substrate to expose a first through-via in the substrate;
   etching the substrate from backside to form a first through-opening penetrating through the substrate, wherein the first through-opening stops on a dielectric layer on a front side of the substrate;
   forming a conductive material on a sidewall of the first through-opening, wherein the conductive material comprises a ring encircling the first through-opening;
   filling the first through-opening with a dielectric material;
   etching the dielectric material to form a second through-opening, wherein the second through-opening is encircled by the ring, and the second through-opening penetrates through the dielectric layer, with a conductive feature on the front side of the substrate exposed to the second through-opening; and
   filling the second through-opening with an additional conductive material to form a second through-via.

10. The method of claim 9, wherein the conductive material further forms a redistribution line electrically coupled to the first through-via, wherein the redistribution line and the ring are formed in common steps.

11. The method of claim 9 further comprising, before the forming the conductive material, forming an isolation ring on sidewalls of the first through-opening.

12. The method of claim 9 further comprising electrically grounding the ring.

13. The method of claim 9, wherein the filling the first through-opening with the dielectric material comprises filling with a polymer.

14. The method of claim 9 further comprising forming a solder region on the backside of the substrate, wherein the solder region is electrically coupled to the second through-via.

15. A method comprising:
  forming an active device at a front surface of a semiconductor substrate;
  forming a dielectric layer on a back surface of a semiconductor substrate, wherein the front surface and the back surface are opposite surfaces of the semiconductor substrate;
  etching the dielectric layer and the semiconductor substrate from a backside of the semiconductor substrate to form a first through-opening penetrating through the dielectric layer and the semiconductor substrate;
  forming a dielectric isolation layer on a sidewall of the first through-opening;
  depositing a conductive material, wherein the conductive material comprises a first portion on the dielectric layer, and a second portion extending into the first through-opening to form a ring encircling the first through-opening;
  patterning the conductive material, wherein a remaining portion of the first portion of the conductive material forms a redistribution line, and wherein the ring remains after the patterning;
  filling the first through-opening with a dielectric material;
  etching the dielectric material to form a second through-opening penetrating through the dielectric material, wherein the second through-opening is encircled by the ring; and
  filling the second through-opening with an additional conductive material to form a first through-via.

16. The method of claim 15 further comprising, before the forming the dielectric layer, performing a backside grinding on the back surface of the semiconductor substrate to expose a second through-via in the semiconductor substrate.

17. The method of claim 16, wherein the redistribution line is electrically coupled to the second through-via.

18. The method of claim 15, wherein the filling the first through-opening with the dielectric material comprises filling with a polymer.

19. The method of claim 15 further comprising, after the second through-opening penetrates through the semiconductor substrate, further etching an additional dielectric layer on a front side of the semiconductor substrate to expose a conductive feature.

20. The method of claim 15, wherein in the etching the semiconductor substrate, the first through-opening stops on an additional dielectric layer on the front surface of the semiconductor substrate, and in the forming the second through-opening, a conductive feature at the front surface of the semiconductor substrate is exposed.

* * * * *